(12) United States Patent
Sansoni et al.

(10) Patent No.: US 11,348,823 B2
(45) Date of Patent: May 31, 2022

(54) COMPLIANT ROBOT BLADE FOR SUBSTRATE SUPPORT AND TRANSFER

(71) Applicant: APPLIED MATERIALS, INC., Santa Clara, CA (US)

(72) Inventors: Steven V. Sansoni, Livermore, CA (US); Jeffrey Brodine, Los Gatos, CA (US); Glen Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 63 days.

(21) Appl. No.: 16/405,414

(22) Filed: May 7, 2019

(65) Prior Publication Data

US 2019/0267275 A1 Aug. 29, 2019

Related U.S. Application Data (62) Division of application No. 14/487,904, filed on Sep. 16, 2014, now Pat. No. 10,312,127.

(60) Provisional application No. 61/878,585, filed on Sep. 16, 2013.

(51) Int. Cl.
*H01L 21/677* (2006.01)
*H01L 21/687* (2006.01)

(52) U.S. Cl.
CPC .. *H01L 21/68707* (2013.01); *H01L 21/67742* (2013.01)

(58) Field of Classification Search
None
See application file for complete search history.

(56) References Cited

U.S. PATENT DOCUMENTS

| | | | |
|---|---|---|---|
| 5,571,325 A | 11/1996 | Ueyama et al. | |
| 6,264,187 B1 | 7/2001 | Hertz et al. | |
| 6,726,195 B1 | 4/2004 | Hertz et al. | |
| 7,073,252 B1 | 7/2006 | Hertz et al. | |
| 7,748,760 B2* | 7/2010 | Kushida | H01L 21/68707 294/213 |
| 9,108,320 B2 | 8/2015 | Furuichi | |
| 9,138,841 B2 | 9/2015 | Moncavage | |
| 9,343,350 B2* | 5/2016 | Arai | H01L 21/67742 |
| 2009/0236786 A1 | 9/2009 | Sanemasa et al. | |
| 2011/0064556 A1* | 3/2011 | Kent | H01L 21/68707 414/751.1 |
| 2012/0088203 A1 | 4/2012 | Mizunaga et al. | |
| 2012/0315113 A1* | 12/2012 | Hiroki | H01L 21/67742 414/217 |
| 2013/0032984 A1 | 2/2013 | Moncavage | |

(Continued)

*Primary Examiner* — Gerald McClain
(74) *Attorney, Agent, or Firm* — Moser Taboada (57) ABSTRACT

Substrate transfer robot blades used to engage and support a substrate during transfer include a blade body having a blade support surface and at least one pad having a top surface and an opposite bottom surface, a central opening extending from the top surface to the bottom surface, and a resilient portion formed from the at least one pad. The resilient portion formed from the at least one pad extends from and cantilevers from a side surface of the central opening of the at least one pad that is disposed directly on the side surface at the end of a long axis of the resilient portion. The resilient portion further includes a curved substrate contact surface on an outermost end of the resilient portion on which a substrate is supported when disposed on the substrate transfer robot blade.

8 Claims, 6 Drawing Sheets

(56) References Cited

U.S. PATENT DOCUMENTS

| | | |
|---|---|---|
| 2014/0265392 A1 | 9/2014 | Pergande et al. |
| 2015/0170954 A1 | 6/2015 | Agarwal et al. |
| 2016/0005638 A1 | 1/2016 | Agarwal et al. |
| 2021/0347584 A1* | 11/2021 | Hashima ............. H01L 21/6838 |

* cited by examiner

COMPLIANT ROBOT BLADE FOR SUBSTRATE SUPPORT AND TRANSFER

CROSS-REFERENCE TO RELATED APPLICATIONS

This application is a divisional of and claims benefit of co-pending U.S. patent application Ser. No. 14/487,904, filed Sep. 16, 2014, which claims benefit of U.S. provisional patent application Ser. No. 61/878,585, filed Sep. 16, 2013. Each of the aforementioned related patent applications is herein incorporated by reference in its entirety.

FIELD

Embodiments of the present disclosure generally relate to semiconductor processing apparatus.

BACKGROUND

Semiconductor substrates are subjected to many different processes in order to manufacture a semiconductor die on the substrate. Modern semiconductor processing systems typically integrate a number of process chambers on a single platform to perform sequential processing steps without removing the substrate from the processing environment. For efficiency purposes, a transfer robot may be used to transfer the substrates between chambers. In some processing systems, transfer robots are used to move substrates outside of the processing environment. A substrate transfer robot blade associated with the transfer robot may be used to engage and support individual substrates during transfer.

Current substrate transfer robot blades support the substrate on non-compliant, or rigid, substrate support surfaces. However, the inventors have observed that acceleration of the robot blades in some transfers result in a force on the substrate which can cause defects in the substrate.

Accordingly, the inventors have provided an improved substrate transfer robot blade.

SUMMARY

Embodiments of substrate transfer robot blades to engage and support a substrate during transfer are provided herein. In some embodiments, the substrate transfer robot blade includes a body having a blade support surface; and a plurality of compliant pads each comprising a contact surface and an opposite bottom surface supported by the body and arranged to support a substrate when disposed on the robot blade.

In some embodiments, a substrate transfer device comprises a robot comprising an arm coupled to the robot at a first end; a robot blade coupled to a second end of the arm, the robot blade comprising: a body having a blade support surface; and a plurality of compliant pads comprising a contact surface and an opposite bottom surface supported by the body and arranged to support a substrate when disposed on the robot blade.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure relate to substrate transfer robot blades to engage and support a substrate during transfer and a substrate transfer apparatus having such a substrate transfer robot blade.

Figure 1:
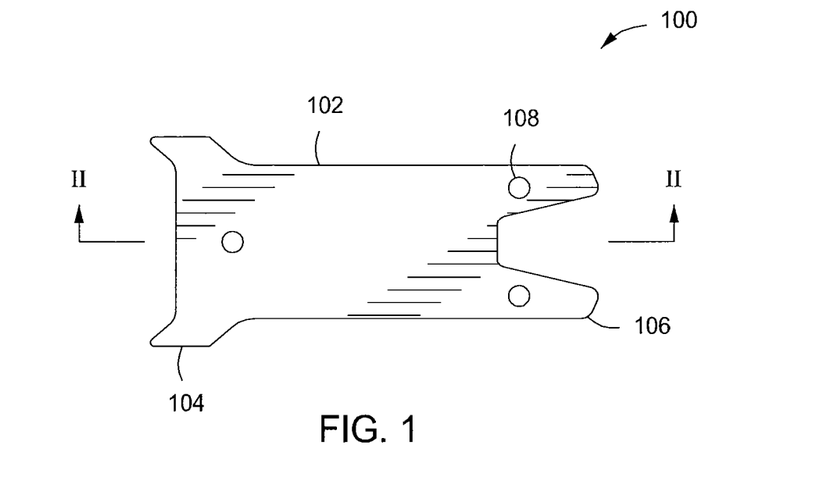
FIG. 1 depicts a plan view of a substrate transfer robot blade according to embodiments of the present disclosure.
Figure 2:
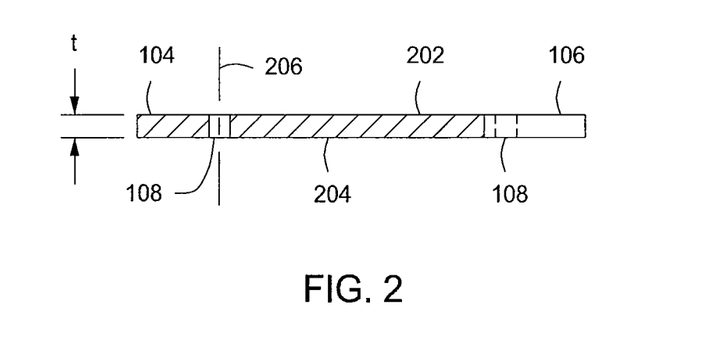
FIG. 2 depicts a sectional view of the substrate transfer robot blade of FIG. 1 taken along line II-II.

FIG. 1 is a plan view of a substrate transfer robot blade, blade 100, comprising a blade body, body 102, a first end 104 adapted for coupling to a transfer robot (e.g., robot 1102, FIG. 11), and a second end 106. The blade 100 has a generally planar blade support surface 202 (as illustrated in FIG. 2) and may have a plurality of passages 108 (3 shown) having an axis. Passages 108 are illustrated as passing through the blade support surface 202, the blade thickness t, and exiting the bottom surface 204 (i.e., passages 108 are through holes). In other embodiments, passages 108 may be blind holes only partially through the thickness t of the body 102. The blade 100 may include one or more cutouts (not shown) to reduce the overall weight of the blade.

In the non-limiting embodiment illustrated in FIG. 2, the passages 108 may have a constant diameter. In some embodiments, the passages 108 may have a varying diameter, for example a tapered diameter or a stepped diameter. In embodiments having a stepped diameter, the passage 108 may have a first diameter at a first portion adjacent to the blade support surface 202 and a second diameter at a second portion adjacent to the bottom surface 204.

Figure 3:
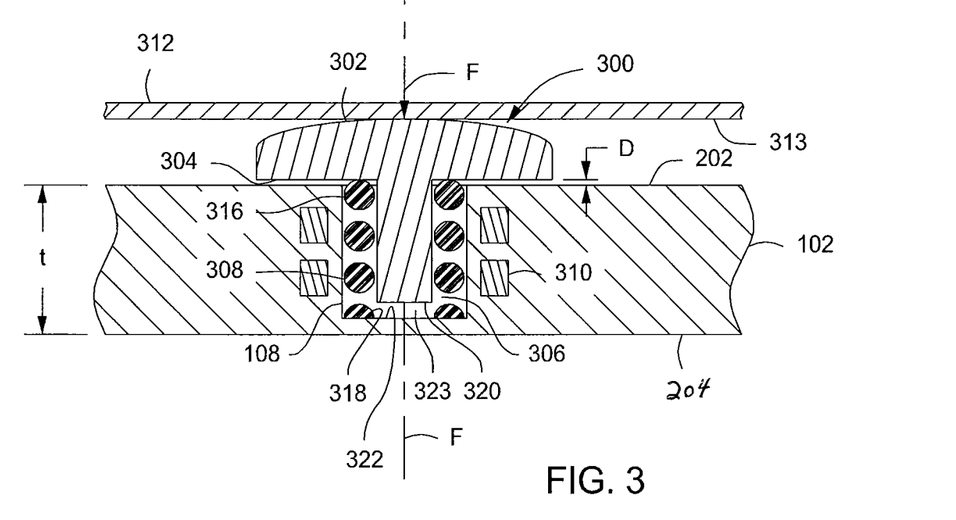
FIG. 3 depicts a sectional view of a portion of a substrate transfer robot blade in accordance with an embodiment of the present disclosure.
Figure 4:
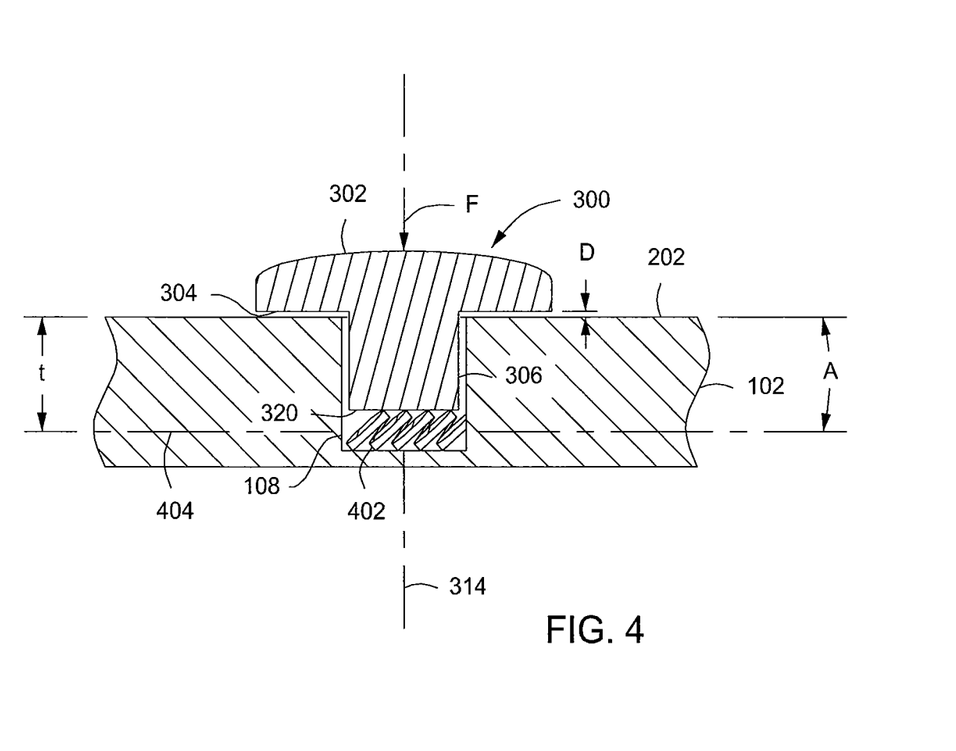
FIG. 4 depicts a sectional view of a portion of a substrate transfer robot blade in accordance with an embodiment of the present disclosure.

In a non-limiting embodiment of the disclosed blade 100, a plurality of compliant substrate supports, for example compliant pads 300, may be supported by the body 102 and arranged to support a substrate 312 when a lower substrate surface 313 is disposed on the blade 100. As illustrated in FIGS. 3 and 4, the compliant pad 300 comprises a contact surface 302 to engage and support a substrate 312 and an opposite surface, lower surface 304. The contact surface 302 may be rounded, such as spherical as illustrated, or may have any other surface configuration or shape to, for example, provide a desired contact area. The compliant pad 300 may be smaller than, the same size as, or larger than the passage 108. The compliant pad 300 may have a pad axis 314.

The compliant pad 300 may be made from materials compatible with the environment in which it is used and the substrate being transferred. Non-limiting examples of suitable materials for the compliant pad 300 include one or more of polymer materials, such as polyimide-based plastics such as Vesper® manufactured by DuPont and polyether ether ketone (PEEK); ceramic materials such as titanium nitride (TiN), alumina ($Al_2O_3$) and silicon carbide (SiC); and metal composites, such as aluminum silicon (AlSi). Surface characteristics of the contact surface 302 may be enhanced by coating the compliant pad 300 with coatings such as diamond-like carbon (DLC) or alumina. In some embodiments, the compliant pad 300 may comprise an electrically conductive material.

A resilient element, for example a compression spring, such as helically wound spring 308, may be at least partially disposed within the passage 108 such that the helical axis of the helically wound spring 308 is aligned with the passage axis 206. For example as illustrated in FIG. 3, the helically wound spring 308 may be positioned coaxially with the passage axis 206, with the uppermost coil 316 of the helically wound spring 308 abutting the lower surface 304 of the compliant pad 300, such that the lower surface 304 is spaced a distance D from the blade support surface 202. The helically wound spring 308 may be fixed against movement in at least one direction parallel to passage axis 206 by anchoring a portion of the helically wound spring 308, for example the lowermost coil 318, against movement in at least one direction parallel to passage axis 206. The bottom wall 322 of the passage 108, when a blind passage, may fix the helically wound spring 308 against such movement. Alternately, a portion of the helically wound spring 308 may rest against a step, or another feature, within the passage 108. A force F directed downwardly (as drawn) parallel to the pad axis 314 would cause the helically wound spring 308 to compress, causing displacement of the compliant pad 300 in the direction of the force F.

In some embodiments, at least a portion of a compliant pad 300 is disposed within a passage 108. For example as illustrated in FIG. 3, a projection 306 may extend from the lower surface 304 and into the passage 108 such that the compliant pad 300 is supported in displacement in a direction parallel to the passage axis 206. The pad axis 314 may align with the passage axis 206 such that the compliant pad 300 is centered over the passage 208. The projection 306 may be adjacent to and guided in displacement by the side walls of the passage. Guides (not shown) may be provided to facilitate displacement of the projection 306 within the passage 108.

As illustrated, in some embodiments the helically wound spring 308 is adjacent to the wall of the passage 108 and axially aligned with the passage axis 206. The projection 306 may extend into the axial space 323 encircled by the coils, for example at least the uppermost coil 316 and lowermost coil 318. The helically wound spring 308 supports the compliant pad 300 as above.

Some embodiments may include one or more displacement attenuators, attenuators 310, disposed in the body 102 proximate to the passage 108. The attenuators 310 may include magnets or magnetic materials to reduce the amplitude of the displacement of the projection 306 within the passage 108. The attenuators 310 therefore also reduce the amplitude of the displacement of the compliant pad 300. If magnets are used as attenuators 310, the inventors believe, without being bound by theory, that displacement of the projection 306 and the helically wound spring 308 in the varying magnetic field between the magnets causes eddy currents which causes a drag effect on the moving components.

Alternately, or additionally, attenuators 310 may comprise an energy absorbing material to absorb and dissipate the impact energy. For example, the energy absorbing material could be placed in the passage 108 to dampen the motion of the projection 306. An energy absorbing material could also be placed between a portion of the compliant pad 300 and the blade support surface 202 to achieve a similar result.

In an alternate non-limiting embodiment illustrated in FIG. 4, the projection 306 may be adjacent to and guided in displacement generally parallel to the passage axis 206 by the side walls of the passage. A resilient element, for example spring 402, may be provided between the lower end 320 of the projection 306 and a support surface of the body, for example the bottom of the passage 108. The resilient element may be a spring, similar to the helically wound spring 308, oriented with the helix axis perpendicular to the passage axis 206. Alternately, the spring 402 may be a helically wound spring 308 positioned coaxially with the passage axis 206 and such that the uppermost coil 316 is adjacent to the lower end 320 of the projection. As above, the lowermost coil 318 may be fixed against movement in at least one direction parallel to passage axis 206.

Figure 5:
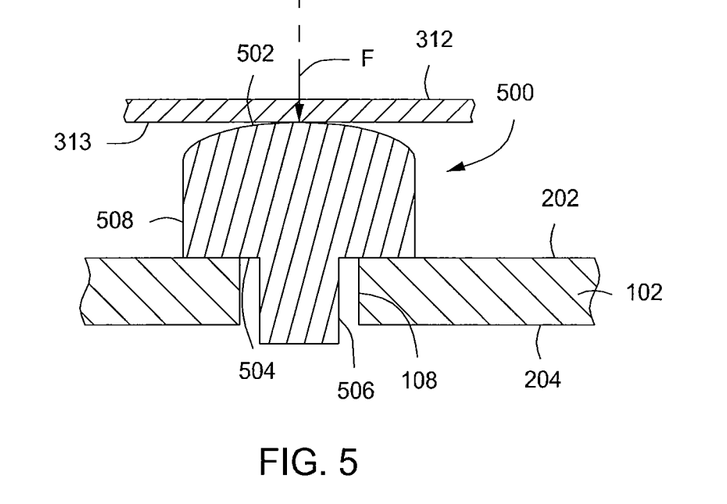
FIG. 5 depicts a sectional view of a portion of a substrate transfer robot blade in accordance with an embodiment of the present disclosure.

According to some embodiments, a compliant pad 500 comprises a contact surface 502 to engage and support a substrate 312 and an opposite surface, lower surface 504. As illustrated in FIG. 5, the lower surface 504 at least partially rests upon the blade support surface 202 to support the compliant pad 500. A projection 506 extends from the lower surface 504 and extends at least partially through the passage 108 when the lower surface 504 is supported upon the blade support surface 202. Clearance may be provided between the passage 108 and the projection 506, or an interference fit may be provided between the passage 108 and the projection 506. The passage 108 may be a through hole as shown in FIG. 5, or may be a blind hole. If the passage 108 is a blind hole, the projection 506 may be in contact with the bottom of the passage, or may not extend to the bottom of the passage.

The compliant pad 500 may comprise one or more of the suitable materials listed above.

Figure 6:
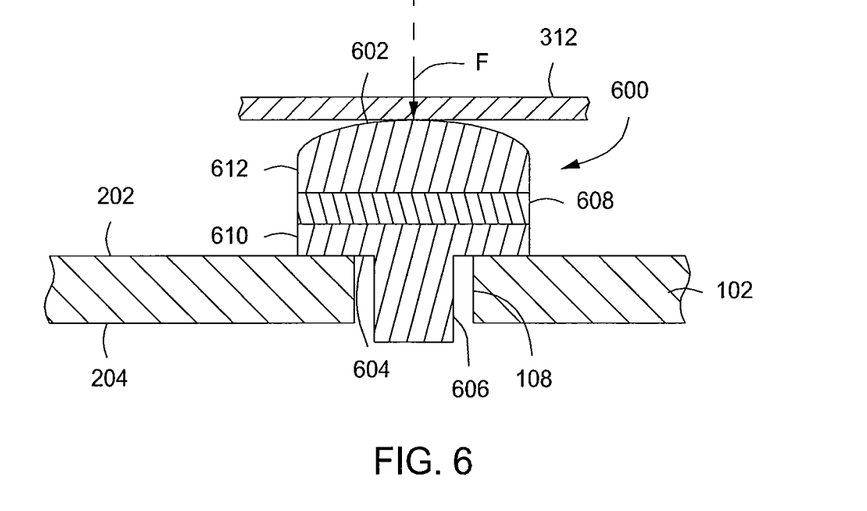
FIG. 6 depicts a sectional view of a portion of a substrate transfer robot blade in accordance with an embodiment of the present disclosure.

FIG. 6 depicts a compliant pad 600 similar to compliant pad 500. As illustrated, compliant pad 600 comprises a contact surface 602 to engage and support a substrate 312 and an opposite surface, lower surface 604. The lower surface 604 at least partially rests upon the blade support surface 202 to support the compliant pad 600. A projection 606 extends from the lower surface 604 and extends at least partially through the passage 108 when the lower surface 504 is supported on the blade support surface 202. Clearance may be provided between the passage 108 and the projection 606, or an interference fit may be provided between the passage 108 and the projection 606. The compliant pad 600 may comprise any of the suitable materials listed above and additionally includes a layer 608 adjacent to one or more layers, layers 610, 612 shown. The layers 608, 610 may be the same material or different materials, and layer 608 may be a metal in some embodiments.

Compliant pads 500 or 600 elastically deform, or deflect, under a force applied to their contact surfaces 502, 602, respectively, directed towards the body 102.

Figure 7:
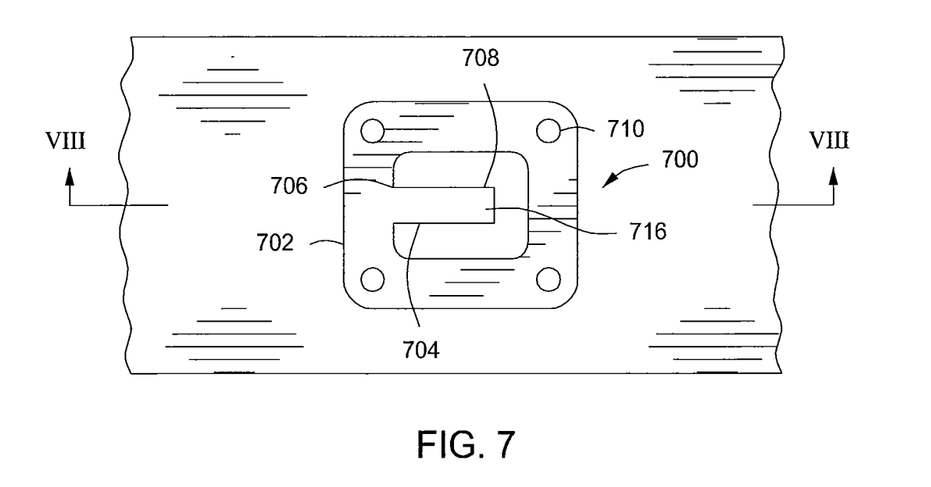
FIG. 7 depicts a plan view of a portion of a substrate transfer robot blade in accordance with an embodiment of the present disclosure.
Figure 8:
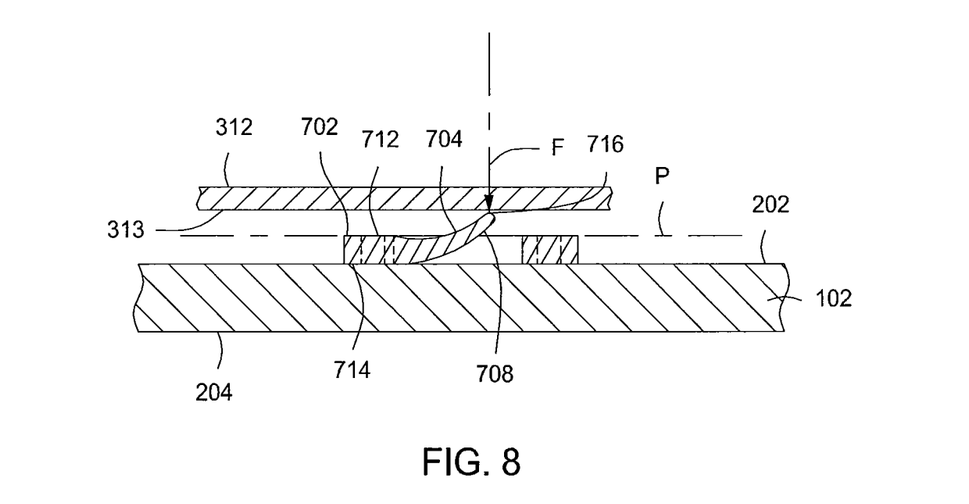
FIG. 8 depicts a sectional view of the substrate transfer robot blade of FIG. 7 taken along line VIII-VIII.

In some embodiments shown in FIGS. 7 and 8, a compliant pad 700 includes a base 702 and a resilient cantilevered arm, arm 704. The base 702 comprises a top surface 712 and a generally planar bottom surface 714 configured to rest upon the blade support surface 202. The base may include openings, such as holes 710 to facilitate attachment of the base 702 to the body 102. The arm 704 is fixed at a first end 706 to a portion of the base 702. A second end 708 is resiliently deformed away from a plane P of the base 702 in a direction away from the base 702 and may include a contact surface 716 configured to engage and support a substrate 312.

Under a force applied to the contact surface 716 in the direction of the body 102, the arm 704 deflects in the direction of the force.

Figure 9:
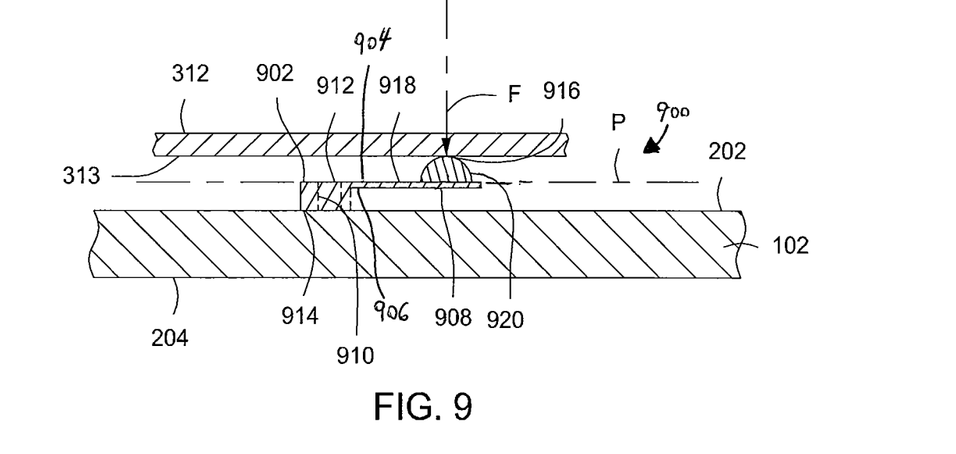
FIG. 9 depicts a sectional view of a substrate transfer robot blade in accordance with an embodiment of the present disclosure.

In some embodiments shown in FIG. 9, a compliant pad 900 includes a base 902 and a resilient cantilevered arm, arm 904, extending from the base 902. The base 902 comprises a top surface 912 and a bottom surface 914 configured to rest upon the blade support surface 202. The base may include openings, such as holes 910 to facilitate attachment of the base 902 to the body 102. The arm 904 is fixed at a first end 906 to the base 902 and free at a second end 908. In some embodiments, an upper surface 918 of the arm 904 may lie in the same plane P as the base 902.

The arm 904 may comprise a contact element 920 disposed on the second end 908 and may include a contact surface 916 configured to engage and support a substrate (e.g., substrate 312). In some embodiments, the arm 904 is formed of titanium and the contact element 920 may include, for example, at least 6 microns of titanium nitride (TiN). The TiN layer may be thermally grown on the second end 908 of the arm 904. In some embodiments, the upper surface 918 of the arm 904 may lie above or below the plane P as long as the contact surface 916 of the contact element 920 lies above the base 902.

Figure 10:
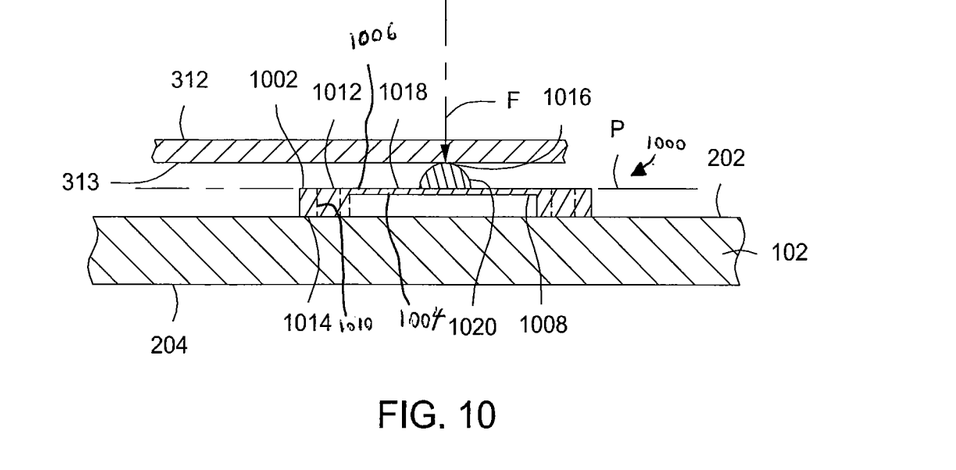
FIG. 10 depicts a sectional view of a substrate transfer robot blade in accordance with an embodiment of the present disclosure.

In some embodiments, and as shown in FIG. 10, a compliant pad 1000 includes a base 1002 on both ends of a resilient platform 1004. The base 1002 comprises a top surface 1012 and a bottom surface 1014 configured to rest upon the blade support surface 202. The base 1002 may include openings, such as holes 1010 to facilitate attachment of the base 1002 to the body 102. The resilient platform 1004 is fixed to the base 1002 at a first end 1006 and at a second end 1008. In some embodiments, an upper surface 1018 of the platform 1004 may lie in the same plane P as the base 1002.

The platform 1004 may comprise a contact element 1020 disposed on the second end 1008 and may include a contact surface 1016 configured to engage and support a substrate 312. In some embodiments, the platform 1004 is formed of titanium and the contact element 1020 may include, for example, at least 6 microns of titanium nitride (TiN). The TiN layer may be thermally grown on the platform 1005 at or near a center of the platform 1004. In some embodiments, the upper surface 1018 of the platform 1004 may lie above or below the plane P as long as the contact surface 1016 of the contact element 1020 lies above the base 1002.

Contact elements 920, 1020 including a titanium nitride top layer as described above advantageously provide increased wear resistance and defect reduction. The inventors have also observed that such contact elements provide a tunable compliance with high temperature resistance based on the thickness of the titanium nitride layer.

During some segments of substrate transfer, the substrate transfer robot blade accelerates from a first velocity to a second velocity when moving from one location to another. When a substrate is supported at rest, for example on lift pins in a chamber, the substrate is at a velocity of 0 relative to the chamber. A substrate transfer robot blade, coupled to a transfer robot, may be used in a segment of a transfer process to transfer the substrate from the lift pins to another location. During the transfer process, the substrate transfer robot blade accelerates the substrate from a velocity of 0 to a transfer speed, typically between about 1 mm/sec. to about 8 mm/sec. For purposes of this disclosure, velocity and acceleration will be in relation to a fixed point, such as a point on the ground or on a process chamber.

If the substrate is accelerated in the vertically upward direction, the acceleration causes a force exerted by the substrate against the substrate transfer robot blade. The force can be represented by the equation F=ma, where "F" represents force, "m" represents mass, and "a" represents acceleration. In the present case, "m" is the mass of the substrate, "a" is the vertical acceleration of the substrate, and "F" is the force exerted by the substrate upon the substrate transfer robot blade as a result of the acceleration. The inventors have noted that the force F generated during a typical transfer of a substrate is in some cases sufficient to damage the substrate at the areas of contact between the substrate and the substrate transfer robot blade.

The mass of the substrate is generally fixed based on the size of the substrate. Therefore, for a substrate of a given mass, a decrease in acceleration can proportionally decrease the force "F" exerted on the substrate during transfer. The acceleration "a" is generally understood mathematically to be the change in velocity divided by the change in time of the velocity change (i.e., "a"=delta V/delta t). In order to decrease the acceleration "a", the change in velocity can be decreased or the time of the velocity change can be increased. For productivity reasons, it is often desirable to transfer the substrate as quickly as possible. It may be desirable, therefore, to decrease the acceleration by increasing the time of the velocity change.

The inventors noted that during substrate transfers, a substrate is supported initially at rest and accelerated to a transfer speed. If this is effected on a transfer robot blade with unyielding, or non-compliant, pads, the substrate experiences a change in velocity over a very short period of time, leading to a significant acceleration as described above. As the delta t in the expression above approaches 0, the handoff becomes an impact as the substrate transfer robot blade contacts the substrate, leading to defect generation.

However, compliant pads allow the substrate to change velocity from 0 to the transfer speed over a longer period of time. Therefore, a substrate supported on compliant pads would experience a lesser acceleration, and a proportionally lesser force F. The decreased force F may reduce defect generation caused by the impact the same change in velocity over a longer time period.

FIGS. 3-10 depict non-limiting embodiments of a substrate transfer blade, blade 100, comprising blade support surface 202 and including compliant pads 300, 500, 600, 700, 900, and 1000 that may beneficially decrease the acceleration of a substrate 312 on a blade during segments of a substrate transfer procedure. For example, the disclosed embodiments may decrease the acceleration of a substrate, and the resultant force at the interface of the substrate and the blade, during substrate transfers.

In FIG. 3, a compliant pad 300 is disposed on a body 102 of a blade 100 (FIGS. 1 and 2) and supported by a resilient element, helically wound spring 308. The helically wound spring 308 is configured to fit within a passage 108 in the body 102 such that the projection 306 fits within the helix between the coils. The length of the helically wound spring 308 is sufficient to support the lower surface 304 of the compliant pad 300 a distance D above the blade support surface 202. The helically wound spring 308 and the passage 108 are configured to support and guide the projection 306 in vertical displacement.

Optional attenuators 310 may lessen the amplitude of the harmonic motion associated with a mass (such as the substrate 312) on a spring (such as helically wound spring 308).

FIG. 4 depicts an alternate embodiment in which a resilient element, spring 402, is positioned to abut against the lower end 320 of the projection 306. The spring 402 may be a helically wound spring, such as a canted coil spring, positioned such that the axis 404 of the helix forms an acute angle A with the blade support surface 202. As illustrated in FIG. 4, the acute angle A is 0 degrees.

As illustrated in FIGS. 3 and 4, a force F applied to the contact surface 302 may cause displacement of the compliant pad 300 in the direction of the force F. This displacement may be resisted by the helically wound spring 308 of FIG. 3 or the spring 402 of FIG. 4.

Resilient elements, other than helically wound spring 308 and spring 402, may be used to support the compliant pad 300 such that the lower surface 304 is spaced a distance from the blade support surface 202. Non-limiting examples of alternate resilient elements include wave springs, disc springs (e.g., Belleville springs), torsion springs, or the like.

In some embodiments, the compliant pad is formed from a compatible material listed above with a hardness such that a resilient element is not needed. For example, as illustrated in FIG. 5, compliant pad 500 is formed form a material such that the pad body 508 acts as a resilient member and deflects, or yields, under a force F, generated at the contact surface 502 as discussed above. The lower surface 504 of the compliant pad 500 is supported on the blade support surface 202. A projection 506 may extend at least partially into passage 108 in the body. Passage 108 may be a through hole as illustrated and the projection may extend beyond the bottom surface 204 or may end within the thickness of the body 102.

As a blade 100 comprising compliant pads 500 contacts a substrate at contact surface 502 during a substrate transfer, the pad body 508 yields, and the time period during which the substrate 312 changes velocity from 0 to transfer speed is extended. As described above, a velocity change over an extended time period decreases the acceleration, and proportionally decreases the force F generated at the contact surface 502 between the substrate 312 and the compliant pad 500.

The compliant pads may be formed from more than one of the compatible materials above. For example, compliant pad 600 in FIG. 6 includes a layer 608 of a material between layers 610 and 612 of material. Layers 610 and 612 may be formed from the same materials or from different materials, such that the compliant pad 600 has the desired hardness to achieve the results above. In some embodiments, layer 608 is a metal. Similar to compliant pad 500, compliant pad 600 has a contact surface 602, a lower surface 604 supported the blade support surface 202, and a projection 606 extending at least partially into passage 108, which may be a through hole or a blind hole.

Returning to FIGS. 7 and 8, the base 702 of compliant pad 700 may be supported by blade support surface 202 such that the second end 708 of the arm 704 is deformed away from plane P to support the substrate 312 on contact surface 716. The arm 704 is configured to yield under the force F generated as discussed above.

As a blade 100 comprising compliant pads 700 contacts a substrate at contact surface 716 during substrate transfer, the arm 704 yields, and the time period during which the substrate 312 changes velocity from 0 to transfer speed is extended. As described above, a velocity change over an extended time period decreases the acceleration, and proportionally decreases the force F generated at the contact surface 716 between the substrate 312 and the compliant pad 700.

Returning to FIG. 9, the base 902 of compliant pad 900 may be supported by the blade support surface 202 such that the second end of the 908 arm 904 is deformed towards the blade support surface 202 to support the substrate 312 on the contact element 920. The arm 904 is configured to yield under the force F generated as discussed above.

Returning to FIG. 10, the base 1002 of compliant pad 1000 may be supported by the blade support surface 202 such that the platform 1004 is deformed towards the blade support surface 202 (i.e., deflects) to support the substrate 312 on the contact element 1020. The platform 1004 is configured to yield under the force F generated as discussed above.

Any combination of the non-limiting examples of compliant pads 300, 500, 600, 700, 900, or 1000 (collectively, compliant pads 1120) may be used on a blade 100 to achieve the desired results of decreased defect generation.

The inventors have also noted that with typical transfer robot blades, a worn or defective substrate support surface needs replacement of the blade itself, leading to extended idle time for the robot, and possibly the processing system. In the present disclosure, a defective or worn compliant pad may be removed from the blade 100 and replaced with minimal impact on productivity. Compliant pads may also be changed based on the substrate or processing environment. A softer compliant pad may be desirable for some substrates or processes, while a harder compliant pad may be desirable for others. Rather than changing the transfer robot blade to accommodate specific needs, with the associated interruption to production, the compliant pads in the inventive substrate transfer blade can be changed quickly to a more suitable compliant pad.

Figure 11:
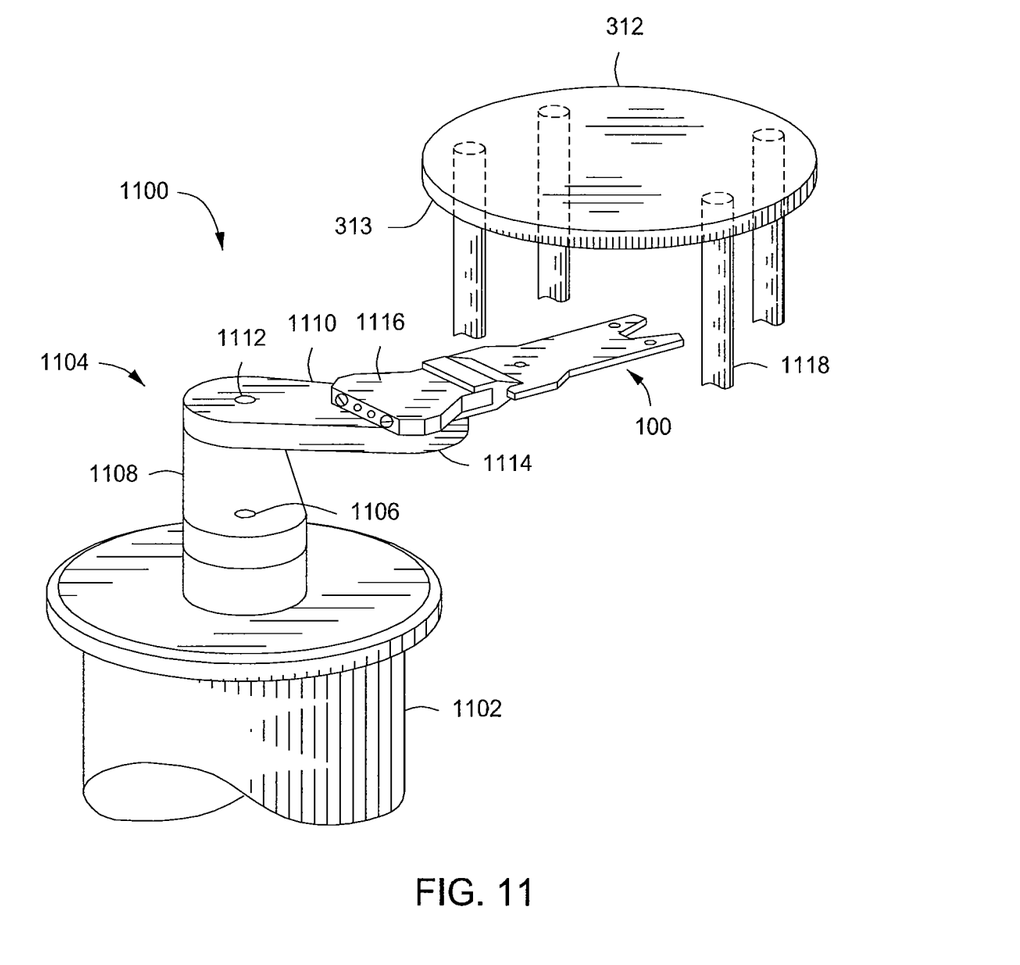
FIG. 11 depicts a substrate transfer apparatus in accordance with an embodiment of the present disclosure.

A substrate transfer apparatus may beneficially include a plurality of compliant pads as disclosed herein. For example, a substrate transfer apparatus 1100 may comprise a robot 1102 comprising a robot arm, arm 1104, coupled to the robot 1102 for vertical and rotational displacement at a first end 1106. The arm 1104 may comprise one or more links, for example first link 1108 and second link 1110 pinned together at 1112. A second end 1114 of the arm 1104 may include a wrist 1116 to which the first end 104 of a blade 100 is coupled. The blade 100 may include any of the compliant pads 1120, or combinations thereof, as disclosed herein.

In operation, the substrate transfer apparatus 1100 may be operated such that the blade 100 is positioned below a substrate 312 supported at rest, for example on a plurality of lift pins 1118. Through mechanical manipulations of the robot 1102 and the arm 1104, the blade 100 is raised from a position below the substrate 312 to bring the compliant pads 1120 into contact with the lower substrate surface 313 to transfer the substrate 312 off of lift pins 1118. In doing so, the robot 1102, through the arm 1104 and the blade 100, accelerate the substrate from a velocity of 0 to a transfer speed. As described above, the acceleration results in a force F at contact points between the substrate 312 and the blade 100. As also described above, the compliant pads 1120 yield to the force such that the change in velocity of the substrate 312 takes place over a longer time period, decreasing the acceleration of the substrate 312 and proportionally decreasing the force F.

While the foregoing is directed to embodiments of the present disclosure, other and further embodiments of the disclosure may be devised without departing from the basic scope thereof.

The invention claimed is:

1. A substrate transfer robot blade, comprising:
a blade body having a blade support surface; and
at least one pad comprising a top surface and an opposite bottom surface, a central opening extending from the top surface to the bottom surface, and a resilient portion formed from the at least one pad, the resilient portion extending and cantilevering from a side surface of the central opening of the at least one pad that is disposed directly on the side surface at the end of a long axis of the resilient portion, and having a curved substrate contact surface on an outermost end of the resilient portion on which a substrate is supported when disposed on the substrate transfer robot blade;
wherein the at least one pad is mounted on the blade body such that a downward force applied by the substrate making contact with the curved substrate contact surface of the at least one pad is at least partially absorbed by the resilient portion before being transferred through the bottom surface of the at least one pad to the blade support surface.

2. The substrate transfer robot blade of claim 1, wherein the at least one pad further comprises:
a base configured for support on the blade support surface.

3. The substrate transfer robot blade of claim 1, wherein at least part of the bottom surface of the at least one pad is supported on the blade support surface.

4. The substrate transfer robot blade of claim 1, wherein the at least one pad is formed of a polymer material.

5. The robot blade of claim 1, wherein the at east one pad is formed from ceramic.

6. The substrate transfer robot blade of claim 1, wherein each of the at least one pads comprises a single resilient portion.

7. A substrate transfer apparatus, comprising:
a robot comprising an arm coupled to the robot at a first end and configured to provide vertical and rotational displacement of the arm; and
a robot blade coupled to a second end of the arm, the robot blade comprising:
a blade body having a blade support surface; and
at least one pad comprising a top surface and an opposite bottom surface, a central opening extending from the top surface to the bottom surface, and a resilient portion formed from the at least one pad, the resilient portion extending and cantilevering from a side surface of the central opening of the at least one pad that is disposed directly on the side surface at the end of a long axis of the resilient portion, and having a curved substrate contact surface on an outermost end of the resilient portion on which a substrate is supported when disposed on the substrate transfer robot blade;
wherein at least one of the at least one compliant pad is mounted on the blade body such that a downward force applied by a substrate making contact with the curved substrate contact surface of the at least one of the at least one compliant pad is at least partially absorbed by the resilient portion before being transferred through the bottom surface of the at least one of the at least one compliant pad to the blade support surface.

8. The substrate transfer apparatus of claim 7, wherein at least one of the at least one compliant pad further comprises:
a base configured for support on the blade support surface.

* * * * *